(12) United States Patent
Shiho et al.

(10) Patent No.: US 7,173,180 B2
(45) Date of Patent: Feb. 6, 2007

(54) SILANE COMPOSITION, SILICON FILM FORMING METHOD AND SOLAR CELL PRODUCTION METHOD

(75) Inventors: Hiroshi Shiho, Tokyo (JP); Hitoshi Kato, Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 11/404,921

(22) Filed: Apr. 17, 2006

(65) Prior Publication Data
US 2006/0185712 A1 Aug. 24, 2006

Related U.S. Application Data

(62) Division of application No. 10/216,790, filed on Aug. 13, 2002, now Pat. No. 7,067,069.

(30) Foreign Application Priority Data

| Aug. 14, 2001 | (JP) | 2001-245947 |
| Oct. 17, 2001 | (JP) | 2001-319304 |
| Dec. 10, 2001 | (JP) | 2001-375992 |

(51) Int. Cl.
*H01L 31/0256* (2006.01)
(52) U.S. Cl. .......... 136/261; 136/258; 427/75; 252/182.3; 106/287.1
(58) Field of Classification Search .......... 136/261, 136/258; 427/75; 252/182.3; 106/287.1
See application file for complete search history.

(56) References Cited

U.S. PATENT DOCUMENTS

| 4,683,146 A * | 7/1987 | Hirai et al. .......... 427/583 |
| 6,086,945 A | 7/2000 | Kamata et al. |
| 6,485,838 B1 | 11/2002 | Shimada et al. |
| 6,503,570 B2 | 1/2003 | Matsuki et al. |
| 6,518,087 B1 | 2/2003 | Furusawa et al. |
| 6,541,354 B1 | 4/2003 | Shimoda et al. |
| 6,846,513 B2 | 1/2005 | Furusawa et al. |
| 2005/0145163 A1 | 7/2005 | Matsuki et al. |

FOREIGN PATENT DOCUMENTS

EP  1 085 560  3/2001

(Continued)

OTHER PUBLICATIONS

W. Kern, et al., J. Vac. Sci. Technol., vol. 14, No. 5, pp. 1082-1099, "Advances in Deposition Processes for Passivation Films," Sep./Oct. 1977.

(Continued)

*Primary Examiner*—Nam Nguyen
*Assistant Examiner*—Anthony Fick
(74) *Attorney, Agent, or Firm*—Oblon, Spivak, McClelland, Maier & Neustadt, P.C.

(57) ABSTRACT

A silane composition for preparing a semiconductor thin films of a solar cell is disclosed. The silane composition contains a polysilane compound represented by the formula $Si_nR_m$ (n is an integer of 3 or more, m is an integer of n to (2n+2) and an m number of R's are each independently a hydrogen atom, alkyl group, phenyl group or halogen atom, with the proviso that when all the m number of R's are hydrogen atoms and m=2n, n is an integer of 7 or more), and at least one silane compound selected from cyclopentasilane, cyclohexasilane and silylcyclopentasilane.

24 Claims, 4 Drawing Sheets

FOREIGN PATENT DOCUMENTS

| | | |
|---|---|---|
| EP | 1 085 578 | 3/2001 |
| EP | 1 085 579 | 3/2001 |
| EP | 1 087 433 | 3/2001 |
| EP | 1085560 A1 * | 3/2001 |
| EP | 1085578 A1 * | 3/2001 |
| EP | 1 092 755 | 4/2001 |
| EP | 1 113 502 | 7/2001 |
| GB | 2 077 710 | 12/1981 |
| JP | 64-029661 | 1/1989 |
| JP | 4-334551 | 11/1992 |
| JP | 7-267621 | 10/1995 |
| JP | 11-49507 | 2/1999 |
| JP | 2004-186320 | 7/2004 |

OTHER PUBLICATIONS

W.E. Spear, et al., Solid State Communications, vol. 17, pp. 1193-1196, "Substitutional Doping of Amorphous Silicon," 1975.

P. A. Bianconi, et al., J. American Chemical Society, vol. 110, pp. 2342-2344, "Poly (N-Hexysilyne): Synthesis and Properties of the First Alkyl Silicon [RSi]$_N$ Network Polymer," 1988.

K. Furukawa, et al., Macromolecules, vol. 23, pp. 3423-3426, "Optical Properties of Silicon Network Polymers," 1990.

K. Mikami, et al., J. Chem. Soc., Chem. Commun., pp. 1161-1163, "Anomalous Threo-Diastereoselectivity in Allylic Silane- or Stannane-Aldehyde Condensation Reactions: New Interpretation of the Antiperiplanar vs. Synclinal Problem on the Transition-State Conformations," 1990.

T. Shono, et al., J. Chem. Soc., Chem. Commun., pp. 896-897, "Electroreductive Synthesis of Polygermane and Germane-Silane Copolymer," 1992.

K. Sakamoto, et al., Macromolecules, vol. 23, No. 20, pp. 4494-4496, "Highly Ordered High Molecular Weight Alternating Polysilylene Copolymer Prepared by Anionic Polymerization of Masked Disilene[1]," 1990.

E. Hengge, et al., Z. Anorg., Allg. Chem., vol. 459, pp. 123-130, "Darstellung und Charakterisierung von Cyclohexasilan $Si_6H_{12}$", 1979.

E. Hengge, et al., Monatshefte Fuer Chemie, vol. 106, pp. 503-512, "Darstellung und Eigenschaften von Cyclopentasilan," 1975.

* cited by examiner

SILANE COMPOSITION, SILICON FILM FORMING METHOD AND SOLAR CELL PRODUCTION METHOD

CROSS REFERENCE TO RELATED APPLICATIONS

This application is a divisional of U.S. patent application Ser. No. 10/216,790, filed Aug. 13, 2002, now U.S. Pat. No. 7,067,069 which claims priority to Japanese patent application No. 2001-245947, filed Aug. 14, 2001, Japanese patent application No. 2001-319304, filed Oct. 17, 2001, and Japanese patent application No. 2001-375992, filed Dec. 10, 2001, all of which are incorporated by reference in their entirety.

DETAILED DESCRIPTION OF THE INVENTION

1. Field of the Invention

The present invention relates to a silicon film forming method, a solar cell production method and a silane composition for use in these methods. More specifically, it relates to a method of forming a silicon film for use in solar cells and electronic devices such as LSI, TFT and photodetectors, a method of producing a solar cell and a silane composition for use in these methods.

2. Description of the Prior Art

Heretofore, thermal CVD (Chemical Vapor Deposition) and plasma CVD making use of monosilane gas or disilane gas, and optical CVD have been used to form an amorphous silicon film or polysilicon film for use in the production of solar cells. In general, thermal CVD (J. Vac. Sci. Technology, vol. 14, pp. 1082 (1977)) is widely used to form a polysilicon film and plasma CVD (Solid State Com., vol. 17, pp. 1193 (1975)) is widely used to form an amorphous silicon film.

However, the formation of a silicon film by CVD involves some problems to be solved, such as the contamination of equipment caused by the by-production of silicon particles and the production of foreign matter in a vapor phase due to use of a vapor phase reaction with the result of a reduced production yield, difficulty in forming a film uniform in thickness on a substrate having an uneven surface due to a gaseous raw material, and poor productivity due to a low film forming speed. Plasma CVD has a problem that a complex and expensive high-frequency generator and vacuum device are required. Therefore, further improvement has been waited for.

As for materials, since silicon hydride which is a highly poisonous reactive gas is used, it is difficult to handle it and an airtight vacuum device is required as it is gaseous. That is, these types of devices are generally bulky and expensive and boost production cost since a large amount of energy is consumed in the vacuum system and plasma system.

A method of coating liquid silicon hydride without using a vacuum system has recently been proposed. JP-A 1-29661 (the term "JP-A" as used herein means an "unexamined published Japanese patent application") discloses a method of forming a silicon-based thin film by liquefying and adsorbing a gaseous raw material to a cooled substrate and reacting it with chemically active atomic hydrogen. Since the raw material silicon hydride is first gasified and then cooled in this method, a complex device is required and it is difficult to control the thickness of the film.

JP-A 7-267621 discloses a method of coating a substrate with liquid silicon hydride having a low molecular weight. In this method, as the system is unstable, it is difficult to handle it and also to obtain a film uniform in thickness when the method is applied to a substrate having a large area because the silicon hydride is liquid.

Although a solid silicon hydride polymer is reported in English Patent GB-2077710A, a film cannot be formed by coating because the polymer is insoluble in a solvent.

SUMMARY OF THE INVENTION

It is an object of the present invention to provide a silicon film forming method which does not require an energy-consuming expensive and bulky device, can be applied to the production of a substrate having a large area and is capable of forming a silicon film with ease.

It is another object of the present invention to provide a silicon oxide film forming method having the same advantages as the above method.

It is still another object of the present invention to provide a silane composition suitable for use in the above methods.

It is a further object of the present invention to provide a method of producing a solar cell, making use of the above silicon forming method of the present invention.

According to the present invention, firstly, the above objects and advantages of the present invention are attained by a silane composition (may be referred to as "first silane composition" hereinafter) comprising:

(A) a polysilane compound represented by the formula $Si_nR_m$ (n is an integer of 3 or more, m is an integer of n to (2n+2) and an m number of R's are each independently a hydrogen atom, alkyl group, phenyl group or halogen atom, with the proviso that when all the m number of R's are hydrogen atoms and m=2n, n is an integer of 7 or more), and (B) at least one silane compound selected from the group consisting of cyclopentasilane, cyclohexasilane and silylcyclopentasilane.

According to the present invention, secondly, the above objects and advantages of the present invention are attained by a silane composition (may be referred to as "second silane composition" hereinafter) comprising:

(A') a product formed from at least one silane compound selected from the group consisting of a hydrogenated chain silane compound represented by the formula $Si_iH_{2i}+2$ (i is an integer of 2 to 8), a hydrogenated cyclic silane compound represented by the formula $Si_jH_{2j}$ (j is an integer of 3 to 10), $Si_4H_4$ and a hydrogenated cage-like silane compound represented by the formula $Si_kH_k$ (k is 6, 8 or 10) upon exposure (photo-irradiation), and (B) at least one silane compound selected from the group consisting of cyclopentasilane, cyclohexasilane and silylcyclopentasilane.

According to the present invention, thirdly, the above objects and advantages of the present invention are attained by a silane composition (may be referred to as "third silane composition" hereinafter) comprising:

(A) a polysilane compound represented by the formula $Si_nR_m$ (n is an integer of 3 or more, m is an integer of n to (2n+2), and an m number of R's are each independently a hydrogen atom, alkyl group, phenyl group or halogen atom, with the proviso that when all the m number of R's are hydrogen atoms and m=2n, n is an integer of 7 or more), (B) at least one silane compound selected from the group consisting of cyclopentasilane, cyclohexasilane and silylcyclopentasilane, and (D) at least one compound selected from the group consisting of a boron compound, arsenic compound, phosphorus compound, antimony compound and modified silane compound represented by the formula $Si_aX_bY_c$ (X is a hydrogen atom and/or halogen atom, Y is a boron atom or phosphorus atom, a is an integer of 3 or more, b is an integer of 1 or more and a or less, and c is an integer of a or more and (2a+b+2) or less).

According to the present invention, in the fourth place, the above objects and advantages of the present invention are attained by a silane composition (may be referred to as "fourth silane composition" hereinafter) comprising:

(A') a product formed from at least one silane compound selected from the group consisting of a hydrogenated chain silane compound represented by the formula $Si_iH_{2i}+2$ (i is an integer of 2 to 8), a hydrogenated cyclic silane compound represented by the formula $Si_jH_{2j}$ (j is an integer of 3 to 10), $Si_4H_4$ and a hydrogenated cage-like silane compound represented by the formula $Si_kH_k$ (k is 6, 8 or 10) upon exposure, (B) at least one silane compound selected from the group consisting of cyclopentasilane, cyclohexasilane and silylcyclopentasilane, and (D) at least one compound selected from the group consisting of a boron compound, arsenic compound, phosphorus compound, antimony compound and modified silane compound represented by the formula $Si_aX_bY_c$ (X is a hydrogen atom and/or halogen atom, Y is a boron atom or phosphorus atom, a is an integer of 3 or more, b is an integer of 1 or more and a or less, and c is an integer of a or more and (2a+b+2) or less).

According to the present invention, in the fifth place, the above objects and advantages of the present invention are attained by a method of forming a silicon film on a substrate, comprising the steps of forming the coating film of the first silane composition or second silane composition of the present invention on the substrate and treating it with heat and/or light in a non-oxidizing atmosphere.

According to the present invention, in the sixth place, the above objects and advantages of the present invention are attained by a method of forming a silicon oxide film on a substrate, comprising the steps of forming the coating film of the first silane composition or second silane composition of the present invention on the substrate and treating it with heat and/or light in an atmosphere containing oxygen and/or ozone.

According to the present invention, in the seventh place, the above objects and advantages of the present invention are attained by a method of producing a solar cell having a structure that at least two semiconductor thin films which differ in the concentration and/or type of an impurity are laminated between a pair of electrodes (may be referred to as "first solar cell production method" hereinafter), wherein at least one of the semiconductor thin films is formed by a method comprising the step of applying the first silane composition or second silane composition of the present invention to the substrate to form a coating film and the step of treating the film with heat and/or light.

According to the present invention, in the eighth place, the above objects and advantages of the present invention are attained by a method of producing a solar cell having a structure that at least two semiconductor thin films which differ in the concentration and/or type of an impurity are laminated between a pair of electrodes (may be referred to as "second solar cell production method" hereinafter), wherein at least one of the semiconductor thin films is a p type or n type silicon thin film formed by a method comprising the step of applying the third silane composition or fourth silane composition of the present invention to the substrate to form a coating film and the step of treating the film with heat and/or light.

DETAILED DESCRIPTION OF THE PREFERRED EMBODIMENT

The present invention will be described in detail hereinunder.

Silane Composition

The first silane composition of the present invention comprises the following components (A) and (B) as essential ingredients.

Component (A)

The component (A) used in the present invention is represented by the formula $SiR_m$ (n is an integer of 3 or more, m is an integer of n to (2n+2), and an m number of R's are each independently a hydrogen atom, alkyl group, phenyl group or halogen atom, with the proviso that when all the m number of R's are hydrogen atoms and m=2n, n is an integer of 7 or more).

The alkyl group represented by R is preferably an alkyl group having 1 to 10 carbon atoms, such as methyl group, ethyl group, n-propyl group, i-propyl group, n-butyl group, sec-butyl group, t-butyl group, n-pentyl group, i-pentyl group, neopentyl group, n-hexyl group, cyclohexyl group, n-heptyl group, n-octyl group, n-nonyl group or n-decyl group.

The halogen atom is preferably fluorine, chlorine and bromine.

The above polysilane compound may be chain, cyclic or cage-like.

Out of the above polysilane compounds, a hydrogenated polysilane compound in which R's are all hydrogen atoms is preferably used. The hydrogenated polysilane compound is a hydrogenated chain polysilane compound represented by the formula $Si_nH_{2n+2}$, hydrogenated cyclic polysilane compound represented by the formula $Si_nH_{2n}$, or hydrogenated cage-like polysilane compound represented by the formula $Si_nH_n$. The expression "cage-like" includes prismane skeleton, cubane skeleton and pentagonal skeleton.

The "n" in the above formulas is an integer of 3 to 100,000, preferably 5 to 50,000 in the hydrogenated chain polysilane compound, an integer of 7 to 100,000, preferably 8 to 50,000 in the hydrogenated cyclic polysilane compound, or an even number of 6 to 100,000, preferably 8 to 50,000 in the hydrogenated cage-like polysilane compound.

When n is smaller than the above smallest value, the film forming properties of the polysilane compound may become unsatisfactory and when n is larger than the above largest value, a reduction in solubility caused by the cohesive force of the polysilane compound may be observed.

These polysilane compounds may be used alone or in combination of two or more.

The polysilane compound used in the present invention can be produced from a monomer having a desired structural unit as a raw material, for example, by the following methods: (a) one in which a halosilane is dehalogenated and polycondensed in the presence of an alkali metal (so-called kipping method, J. Am. Chem. Soc., 110, 2342 (1988)) and Macromolecules, 23, 3423 (1990)); (b) one in which a halosilane is dehalogenated and polycondensed by electrode reduction (J. Chem. Soc., Chem. Commun., 1161 (1990) and J. Chem. Soc., Chem. Commun., 896 (1992)); (c) one in which a hydrosilane is dehydrated and polycondensed in the presence of a metal catalyst (JP-A 4-334551); (d) one in which a disylene crosslinked by bisphenyl is anion polymerized (Macro Molecules, 23, 4494 (1990); (e) one in which a hydro-substituted or halogen-substituted polysilane compound may be induced by a known method (for example, Z. Anorg. Allg. Chem., 459, 123–130 (1979), E. Hengge et al., Mh. Chem. Vol. 106, pp. 503, 1975) after a cyclic silicon compound substituted by a phenyl group or alkyl group is synthesized by any one of the above methods; and (f) one in which a polysilane compound having a higher molecular weight can be obtained by exposing a silane compound synthesized by any one of the above methods.

Component (B)

The component (B) used in the present invention is at least one silane compound selected from the group consisting of cyclopentasilane, cyclohexasilane and silylcyclopentasilane. These are represented by the following respective formulas (1) to (3).

These silane compounds can be obtained from decaphenylcyclopentasilane and dodecaphenylcyclopentasilane produced from diphenyl dichlorosilane.

In the present invention, these silane compounds may be used alone or as a mixture of two or more.

When the above polysilane compound as the component (A) becomes a polymers having a polymerization degree n in the formula $Si_nR_m$ of 10 or more, its solubility in a general-purpose solvent such as a hydrocarbon-based solvent or ether-based solvent becomes so low that it is substantially insoluble. Therefore, it is substantially impossible to apply this polysilane compound to a substrate and convert it into a silicon film.

It has been found in the present invention that a specific liquid silane compound (above component (B)) has excellent solubility unlike a polysilane compound insoluble in a solvent and makes it possible to use a polysilane compound as a raw material for a semiconductor thin film.

A film formed by using this polysilane compound having a relatively high molecular weight as a raw material for a silicon film is fine and has excellent quality such as uniformity.

The proportion of the polysilane compound to the above silane compound constituting the solution composition of the present invention is preferably 0.01 to 1,000 wt %, more preferably 0.05 to 500 wt %, particularly preferably 0.1 to 100 wt %.

When this value is smaller than 0.01 wt %, the formed coating film may be too thin and not become a continuous silicon film. When this value is larger than 1,000 wt %, the polysilane compound may not be dissolved completely.

The first silane composition of the present invention may contain silicon particles (component (C)) in addition to the above components (A) and (B).

Component (C)

The silicon particles used in the present invention may be a commercially available product or synthesized by a method disclosed by JP-A 11-49507. The silicon particles have a purity of preferably 99% or more, more preferably 99.9% or more, particularly preferably 99.99% or more. When the purity is lower than 99%, the formed silicon film may not exhibit semiconductor characteristics disadvantageously.

The silicon particles have a particle diameter of preferably 0.005 to 1,000 :m, particularly preferably 0.005 to 100 :m. The particle diameter can be suitably selected according to a desired film thickness and the shape and the particle size distribution of the silicon particles are not particularly limited.

The amount of the silicon particles is preferably 0.01 to 200 wt %, more preferably 0.1 to 100 wt % based on the total weight of the above components (A) and (B).

The silicon particles may be amorphous or crystalline. When a high-quality crystalline silicone thin film is to be formed at 600 EC. or less, crystalline silicon particles are preferably used. When crystalline silicon particles are used to form a silicon film by applying the silane composition of the present invention and treating it with heat and/or light, they serve as crystal nuclei, thereby making it possible to promote crystal growth.

Since silicon particles are dispersed in the silane composition, adhesion to the substrate is greatly improved at the time of forming a silicon film, whereby even when the thickness of the film is greatly increased, the film does not crack or peel off and accordingly, a homogeneous silicon film can be formed.

A description is subsequently given of the second silane composition of the present invention.

The second silane composition comprises a polysilane compound which is a product (component (A')) formed from the a specific silane compound upon exposure in place of the polysilane compound (component (A)) of the first silane composition.

When the polysilane compound is synthesized by exposing the silane compound, the silane compound as a raw material is preferably a hydrogenated chain silane compound represented by the formula $Si_iH_{2i+2}$ (i is an integer of 2 to 8, preferably 2 to 4), a hydrogenated cyclic silane compound represented by the formula $Si_jH_{2j}$ (j is an integer of 3 to 10, preferably 3 to 6), $Si_4H_4$ or a hydrogenated cage-like silane compound represented by the formula $Si_kH_k$ (k is 6, 8 or 10). Out of these, the above hydrogenated cyclic silane compound is more preferred and at least one compound selected from the group consisting of cyclopentasilane, cyclohexasilane and silylcyclopentasilane is particularly preferred.

These silane compounds may be used alone or as a mixture of two or more.

For the exposure of the silane compound, a low-pressure or high-pressure mercury lamp, deuterium lamp, discharge lamp of rare gas such as argon, krypton or xenon, YAG laser, argon laser, carbonic dioxide laser or excimer laser such as XeF, XeCl, XeBr, KrF, KrCl, ArF or ArCl may be used as a light source in addition to visible radiation, ultraviolet radiation and far ultraviolet radiation. The light source preferably has an output of 10 to 5,000W. In general, an output of 100 to 1,000 W suffices. The wavelength of the light source is not particularly limited if it is somewhat absorbed by the raw material silane compound. However, it is preferably 170 to 600 nm.

The temperature for carrying out the above exposure is preferably room temperature to 300 EC. The exposure time is 0.1 to 30 minutes. The exposure is preferably carried out in a non-oxidizing atmosphere.

The exposure may be carried out in the presence of a suitable solvent. The solvent may be identical to a solvent disclosed hereinafter as an optional component to be added to the composition of the present invention.

As for what is not described of the second silane composition herein, it should be understood that the description of the first silane composition should be applied directly or with modifications obvious to one of ordinary skill in the art.

A description is subsequently given of the third silane composition.

The third silane composition further comprises at least one compound selected from the group consisting of a boron compound, arsenic compound, phosphorus compound, antimony compound and modified silane compound as a component (D) in addition to the first silane composition. That is, the third silane composition of the present invention comprises the above components (A), (B) and (D) as essential ingredients and may further comprise the component (C).

Component (D)

The component (D) in the present invention is at least one compound selected from the group consisting of a boron compound, arsenic compound, phosphorus compound, antimony compound and modified silane compound represented by the formula $Si_aX_bY_c$ (X is a hydrogen atom and/or halogen atom, Y is a boron atom or phosphorus atom, a is an integer of 3 or more, b is an integer of 1 or more and a or less, and c is an integer of a or more and (2a+b+2) or less).

The above boron compound is, for example, a boron hydride, alkylboron, arylboron or boron compound having a trimethylsilyl group. Examples of the boron compound include $B_2H_6$, $BPh_3$, $BMePh_2$, $B(t-Bu)_3$, $B(SiMe_3)_3$, PhB$(SiMe_3)_2$ and $Cl_2B(SiMe_3)$. Ph is a phenyl group, and Me is a methyl group. The same shall apply hereinafter.

The above arsenic compound is, for example, an alkylarsenic, arylarsenic or arsenic compound having a trimethylsilyl group. Examples of the arsenic compound include $AsPh_3$, $AsMePh_2$, $As(t-Bu)_3$, $As(SiMe_3)_3$, $PhAs(SiMe_3)_2$ and $Cl_2As(SiMe_3)$ t-Bu is a tertiary butyl group. The same shall apply hereinafter.

The above phosphorus compound is, for example, an alkylphosphorus, arylphosphorus or phosphorus compound having a trimethylsilyl group. Examples of the phosphorus compound include $PPh_3$, $PMePh_2$, $P(t-Bu)_3$, $P(SiMe_3)_3$, $PhP(SiMe_3)_2$ and $Cl_2P(SiMe_3)_3$.

The above antimony compound is, for example, an alkylantimony or arylantimony. Examples of the antimony compound include $SbPh_3$, $SbMePh_2$ and $Sb(t-Bu)_3$.

Besides these, $SbAs(SiMe_3)_2$ and $Sb_2As(SiMe_3)$ which contain antimony and arsenic in one molecule are also preferably used.

Illustrative examples of the modified silane compound represented by the above formula $Si_aX_bY_c$ (X is a hydrogen atom and/or halogen atom, Y is a boron atom or phosphorus atom, a is an integer of 3 or more, b is an integer of 1 or more and a or less, and c is an integer of a or more and (2a+b+2) or less) include compounds represented by the following formulas.

Compound 1

Compound 2

Compound 3

Compound 4

Compound 5

Compound 6

Compound 7

Compound 8

-continued

Compound 9

Compound 10

Compound 11

Compound 12

Compound 13 compound 14

Compound 15 compound 16

Compound 17

-continued

Compound 18

Compound 19

Compound 20

$SiH_3(SiH_2)_eBH_2$ compund 21

$SiCl_3(SiCl_2)_eBCl_2$ compund 22

In the above formulas, u is an integer of 0 to 10, and e is an integer of 2 or more.

The compounds represented by the above formulas are only modified silane compounds comprising a boron atom(s). Modified silane compounds comprising a phosphorus atom(s) are silane compounds having the same skeletons as above, that is, silane compounds obtained by substituting the boron atom(s) of the above formulas by a phosphorus atom.

These compounds may be synthesized from a monomer such as halogenated boron, halogenated phosphorus or halogenated silane having a structural unit in the same manner as the above component (A).

The content of the component (D) in the third silane composition is 100 parts or less by weight, preferably 0.01 to 50 parts by weight, particularly preferably 0.1 to 10 parts by weight based on 100 parts by weight of the component (A).

As for what is not described of the third silane composition herein, it should be understood that the description of the first silane composition should be applied directly or with modifications obvious to one of ordinary skill in the art.

A description is subsequently given of the fourth silane composition.

The fourth silane composition further comprises at least one compound selected from the group consisting of a boron compound, arsenic compound, phosphorus compound, antimony compound and modified silane compound as a component (D) in addition to the second silane composition.

That is, the fourth silane composition comprises the above components (A'), (B) and (D) as essential ingredients. It may further comprise the component (C).

These components have already been described in the sections of the second silane compound and the third silane compound.

As for what is not described of the fourth silane composition herein, it should be understood that the descriptions of the second silane composition and the third silane composition are applied directly or with modifications obvious to one of ordinary skill in the art.

The first to fourth silane compositions of the present invention may further comprise other components in limits that do not impair the functions of the compositions of the present invention.

Other Components

The other components include a surfactant, for example.

The surfactant may be cationic, anionic, amphoteric or nonionic. The nonionic surfactant is particularly preferred because it improves the wettability of an object to be applied by the composition and the leveling properties of the coating film and prevents the formation of irregularities on the coating film and the formation of an orange skin-like surface.

The nonionic surfactant is, for example, a fluorine-based surfactant having a fluoroalkyl group or perfluoroalkyl group or a polyether alkyl-based surfactant having an oxyalkyl group.

Examples of the fluorine-based surfactant include F Top EF301, EF303 and EF352 (Shinakita Kasei Co., Ltd.), Megafac F171 and F173 (Dainippon Ink and Chemicals, Inc.), Asahi Guard AG710 (Asahi Glass Co., Ltd.), Florade FC-170C, FC430 and FC431 (Sumitomo 3M Limited), Surflon S-382, SC101, SC102, SC103, SC104, SC105 and SC106 (Asahi Glass Co., Ltd.), BM-1000 and 1100 (B. M-Chemie Co., Ltd.), Schsego-Fluor (Schwegmann Co., Ltd.), $C_9F_{19}CONHC_{12}H_{25}$, $C_8F_{17}SO_2NH—(C_2H_4O)_6H$, $C_9F_{17}O(Pulronic\ L-35)C_9F_{17}$, $C_9F_{17}O(Pulronic\ P-84)C_9F_{17}$ and $C_9F_{17}O(Tetronic-704)(C_9F_{17})_2$ (Pulronic L-35: polyoxypropylene-polyoxyethylene block copolymer having an average molecular weight of 1,900 of Asahi Denka Kogyo K.K.; Pulronic P-84: polyoxypropylene-polyoxyethylene block copolymer having an average molecular weight of 4,200 of Asahi Denka Kogyo K.K.; Tetronic-704: N,N,N', N'-tetrakis(polyoxypropylene-polyoxyethylene block copolymer) having an average molecular weight of 5,000 of Asahi Denka Kogyo K.K.).

The polyether alkyl-based surfactant is, for example, a polyoxyethylene alkyl ether, polyoxyethylene allyl ether, polyoxyethylene alkyl phenol ether, polyoxyethylene aliphatic acid ester, sorbitan fatty acid ester, polyoxyethylene sorbitan fatty acid ester or oxyethylene oxypropylene block copolymer.

Examples of the polyether alkyl-based surfactant include Emalgen 105, 430, 810 and 920, Leodole SP-40S, TW-L120, Emanol 3199 and 4110, Excel P-40S, Bridge 30, 52, 72 and 92, Arassel 20, Emasol 320, Tween 20 and 60, and Marge 45 (Kao Corporation), and Nonibole 55 (Sanyo Chemical Industries, Ltd.). Other nonionic surfactants include polyoxyethylene fatty acid esters, polyoxyethylene sorbitan fatty acid esters and polyalkylene oxide block copolymers, as exemplified by Chemistat 2500 (Sanyo Chemical Industries, Ltd.), SN-EX9228 (San Nopco Co., Ltd.) and Nonale 530 (Toho Kagaku Kogyo Co., Ltd.).

The amount of the surfactant is preferably 10 parts or less by weight, particularly preferably 0.1 to 5 parts by weight based on 100 parts by weight of the total weight of the composition. When the amount is larger than 10 parts by weight, the obtained composition readily foams and may thermally discolor disadvantageously.

The above silane compositions of the present invention may comprise a solvent in addition to the above components. The solvent which can be used in the present invention preferably has a boiling point at atmospheric pressure of 30 to 350 EC. When the used solvent has a boiling point lower than 30 EC, the solvent evaporates before the formation of a coating film, whereby it may be difficult to form a satisfactory coating film. When the used solvent has a boiling point higher than 350 EC, the evaporation of the solvent is delayed with the result that the solvent may remain in the coating film, whereby it may be difficult to obtain a satisfactory silicon film after the subsequent step of a heat and/or light treatment.

Any solvent may be used in the present invention unless it precipitates the components (A), (B), (C) or (D) contained in the respective compositions, causes phase separation and reacts with these components. Examples of the solvent include hydrocarbon-based solvents such as n-pentane, n-hexane, n-heptane, n-octane, decane, dodecane, cyclohexane, cyclooctane, styrene, dicyclopentane, benzene, toluene, xylene, coumene, durene, indene, tetrahydronaphthalene, decahydronaphthalene and squalane; ether-based solvents such as diethyl ether, dipropyl ether, ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, tetrahydrofuran tetrahydropyran, 1,2-dimethoxyethane, bis(2-methoxyethyl)ether, p-dioxane and tetrahydrofuran; and polar solvents such as propylene carbonate, (-butyrolactone, N-methyl-2-pyrrolidone, dimethyl formamide, acetonitrile, dimethyl sulfoxide, methylene chloride and chloroform. Out of these, hydrocarbon-based solvents are preferred from the viewpoint of stability of the solution thereof. These solvents may be used alone or as a mixture of two or more.

When the above solvent is used, the amount thereof may be suitably adjusted according to a desired thickness of a semiconductor thin film. However, it is preferably 10,000 parts or less by weight, particularly preferably 5,000 parts or less by weight based on 100 parts by weight of the total of the components (A), (B), (C) and (D). When the amount is larger than 10,000 parts by weight, a polysilicon compound may separate out disadvantageously.

Method of Forming a Silicon Film or Silicon Oxide Film

A silicon film can be formed on a substrate by forming the coating film of the first silane composition or the second silane composition on the substrate and then treating it with heat and/or light in a non-oxidizing atmosphere, or a silicon oxide film can be formed on the substrate by treating it with heat and/or light in an oxidizing atmosphere.

To the silane composition used in the above method may be added colloidal silica dispersed in a suitable dispersion medium. This colloidal silica is used to increase the concentration of silicon in the silane composition and the thickness of the obtained coating film can be controlled by the amount of this component.

When the colloidal silica is used, it is preferred to select a dispersion medium in consideration of compatibility between the used silane compound and an organic solvent as an optional component. Compounds enumerated as the solvent which is an optional component of the present invention may be used as the dispersion medium.

Fine powders of a metal oxide such as aluminum oxide, zirconium oxide or titanium oxide may be suitably mixed with the above silane composition in order to prevent the gelation of the composition, increase the viscosity of the composition, improve the heat resistance, chemical resistance, hardness and adhesion of the obtained silicon oxide film and further obtain antistatic properties.

In the above method, the above silane composition is applied to the substrate to a thickness of preferably 0.005 to 10 μm, particularly preferably 0.01 to 5 μm by suitable means such as spray coating, roll coating, curtain coating, spin coating, screen printing, offset printing or ink jet printing. When the composition comprises a solvent, it should be understood that the thickness of the film is a value obtained after the removal of the solvent.

To form a silicon film, the film forming step is carried out in a non-oxidizing atmosphere. To realize this atmosphere, the atmosphere should contain substantially no oxidizing substance such as oxygen or carbon dioxide. The atmosphere is preferably an atmosphere of nitrogen, hydrogen, rare gas or mixture thereof.

In order to form the fine and adhesive coating film of the composition of the present invention on the substrate, the coating film is preferably exposed to light at least once before or after coating.

For the exposure of the coating film, a low-pressure or high-pressure mercury lamp, deuterium lamp, discharge lamp of rare gas such as argon, krypton or xenon, YAG laser, argon laser, carbonic acid gas laser or excimer laser such as XeF, XeCl, XeBr, KrF, KrCl, ArF or ArCl may be used as a light source in addition to visible radiation, ultraviolet radiation and far ultraviolet radiation. The light source preferably has an output of 10 to 5,000W. In general, an output of 100 to 1,000W suffices. The wavelength of the light source is not particularly limited if it is somewhat absorbed by the polysilane compound contained in the composition or the coating film. However, it is preferably 170 to 600 nm.

The temperature for carrying out the above exposure is preferably room temperature to 300°C. The exposure time is 0.1 to 30 minutes. The exposure is preferably carried out in a non-oxidizing atmosphere like the step of forming a film of the polysilane compound.

It is assumed that this exposure causes the cleavage and re-bonding reaction of a silicon-silicon bond of the polysilane compound contained in the coating film to improve the physical properties such as adhesion to a substrate of the film. It is further considered that the silane compound contained in the coating film is ring-opening polymerized by exposure to become a polysilane, thereby forming a finer film.

The thus formed coating film is treated with heat and/or light in a suitable atmosphere to be converted into a silicon film or silicon oxide film. The treatment preferably includes a heat treatment step.

To form a silicon film, the thus formed coating film of the composition of the present invention is heated at preferably 100 to 1,000°C, more preferably 200 to 850°C, particularly preferably 300 to 500°C in a non-oxidizing atmosphere, preferably an argon atmosphere or hydrogen-containing argon. In general, at an ultimate temperature of about 550°C or less, an amorphous silicon film is obtained and at a temperature higher than that, a polysilicon film is obtained. When the ultimate temperature is lower than 300°C, the thermal decomposition of the polysilane compound does not proceed to the full and therefore a silicon film having a sufficient thickness may not be formed. To obtain a polysilicon film, the above obtained amorphous silicon film may be exposed to laser beams to be converted into a polysilicon film. The atmosphere for irradiating the laser beams is preferably an atmosphere of inert gas such as helium or argon, or a mixture of it and reducing gas such as hydrogen.

The exposure may be carried out in the same manner as the exposure for forming the film of the composition of the present invention.

To form a silicon oxide film, the above formed coating film of the composition of the present invention is treated with heat and/or light in the presence of oxygen and/or ozone, for example, air.

The above heat treatment is carried out by using heating means such as a hot plate or oven at a temperature of preferably 100 to 800°C, more preferably 200 to 600°C, particularly preferably 300 to 500°C for preferably 1 to 300 minutes, more preferably 5 to 120 minutes, particularly preferably 10 to 60 minutes. When the treatment temperature is lower than 100°C, an oxidation reaction may not proceed to the full and when the treatment temperature is higher than 800°C, the film may crack after oxidation disadvantageously. When the treatment time is shorter than 1 minute, the oxidation reaction may not proceed to the full. The coating film does not need to be heated for more than 300 minutes.

The silicon film or silicon oxide film formed in the present invention may contain an impurity such as carbon besides silicon oxide in limits that do not impair the object of the present invention.

The thickness of the silicon film and the silicon oxide film obtained in the present invention is preferably 0.005 to 20 μm, more preferably 0.01 to 10 μm.

The thickness of the silicon film or silicon oxide film may be increased, for example, a silicon oxide film having a thickness of about 1 mm can be obtained by repeating the film forming method of the present invention several times.

The substrate used to form the silicon oxide film of the present invention thereon is not particularly limited. The substrate to be covered with a coating film may have a flat surface or uneven surface with a level difference and is not limited to a particular surface. When the oxidation of the coating film of the polysilane compound is carried out by heating, the material of the substrate preferably stands the treating temperature.

The substrate is made from, for example, glass, metal, plastic or ceramic. Examples of the glass include quartz glass, borosilicate glass, soda glass, lead glass and lanthanum-based glass. Examples of the metal include gold, silver, copper, nickel, silicon, aluminum, iron and stainless steel. Examples of the plastic include polyimide, polyether sulfone, norbornene-based ring-open polymers and hydrides thereof. The shape of the substrate may be block-like, plate-like or film-like and is not particularly limited.

The silicon film or silicon oxide film is thus formed in the present invention. The method of the present invention is capable of forming a fine silicon film or silicon oxide film regardless of the area or shape of the substrate and can be advantageously used to produce a device which requires high reliability. The method of the present invention does not need an expensive device such as a vacuum device, thereby reducing costs.

When the coating film is to be treated with light to convert it into a silicon film or silicon oxide film, a silicon film or silicon oxide film having a desired pattern can also be formed by exposing part of the coating film selectively using a photomask having a desired pattern.

Solar Cell Production Method

A description is firstly given of a first method of producing a solar cell.

In the first production method, the first silane composition or second silane composition of the present invention is used.

The first solar cell production method is characterized in that in order to produce a solar cell having a structure that at least two semiconductor thin films which differ in the concentration and/or type of an impurity are laminated between a pair of electrodes, at least one of the semiconductor thin films is formed from the first silane composition or the second silane composition.

In the present invention, the semiconductor thin film is formed by applying the above silane composition to a substrate and treating it with heat and/or light.

The substrate used in the method is made from, for example, glass, metal, plastic or ceramic. Examples of the glass include quartz glass, borosilicate glass, soda glass, lead glass and lanthanum-based glass. Examples of the metal include gold, silver, copper, nickel, silicon, aluminum, iron, tungsten and stainless steel. A glass or plastic substrate having the above conductive metal or conductive metal oxide film such as an ITO film thereon may also be used. Examples of the plastic include polyimide, polyether sulfone, norbornene-based ring-open polymers and hydrides thereof. The shape of the substrate may be block-like, plate-like or film-like and is not particularly limited and the surface to be covered with the coating film may be flat or uneven with a level difference. When the step of converting the coating film into a semiconductor thin film includes a heat treatment step, a substrate made from a material which can stand the heat is preferred.

The silane composition is applied to the substrate to a thickness of preferably 0.005 to 10 :m, particularly preferably 0.01 to 5 :m by suitable means such as spray coating, roll coating, curtain coating, spin coating, screen printing, offset printing, ink jet printing or dip coating. When the silane composition comprises a solvent, it should be understood that the thickness of the film is a value obtained after the removal of the solvent.

It is advantageous to carry out the above film forming step preferably in a non-oxidizing atmosphere. To realize this atmosphere, the atmosphere should contain substantially no oxidizing substance such as oxygen or carbon dioxide. The atmosphere is preferably an atmosphere of nitrogen, hydrogen, rare gas or mixture thereof.

This coating step may be carried out while exposure is performed. The exposure conditions are the same as the exposure described hereinafter which is carried out to convert the coating film of the composition into a semiconductor thin film.

To convert the above coating film of the composition into a semiconductor thin film, the heat treatment is carried out in a non-oxidizing atmosphere at preferably 100 to 1,000 EC, more preferably 200 to 850 CE, particularly preferably 300 to 750 EC, for preferably 1 to 600 minuets, more preferably 5 to 300 minuets, particularly preferably 10 to 150 minutes. In general, at an ultimate temperature of about 550 EC or less, an amorphous semiconductor thin film is obtained and at a temperature higher than that, a polycrystalline semiconductor thin film is obtained. When the ultimate temperature is lower than 300 EC, the thermal decomposition of the polysilane compound does not proceed to the full and therefore a desired silicon film may not be formed.

The heat treatment may be carried out in an argon atmosphere or hydrogen-containing argon as the above non-oxidizing atmosphere.

For the optical treatment for converting the coating film of the composition into a semiconductor thin film, a low-pressure or high-pressure mercury lamp, deuterium lamp, discharge lamp of rare gas such as argon, krypton or xenon, YAG laser, argon laser, carbonic dioxide laser or excimer laser such as XeF, XeCl, XeBr, KrF, KrCl, ArF or ArCl may be used as a light source in addition to visible radiation, ultraviolet radiation and far ultraviolet radiation. The light source generally has an output of 10 to 5,000 W. In general, an output of 100 to 1,000 W suffices. The wavelength of the light source is not particularly limited if it is somewhat absorbed by the polysilane compound contained in the composition or the coating film. However, it is preferably 170 to 600 nm.

The temperature for carrying out the above exposure is preferably room temperature to 300 EC and the exposure time is 0.1 to 30 minutes. The exposure is preferably carried out in the same non-oxidizing atmosphere like the coating film forming step.

The semiconductor thin film is formed in the present invention as described above. The formed semiconductor thin film is an i type semiconductor thin film. The thus formed i type semiconductor thin film can be converted into a p type semiconductor thin film by carrying out the step of doping a boron atom or an n type semiconductor thin film by carrying out the step of doping at least one atom selected from arsenic, phosphorus and antimony.

The thus formed p type or n type semiconductor thin film may be further doped with a boron atom or at least one atom selected from arsenic, phosphorus and antimony to increase the concentration of an impurity in the semiconductor thin film.

The above doping step can be carried out by a known thermal diffusion method or ion implantation method, or by forming the coating film of the third silane composition or the fourth silane composition comprising the above component (D) on the thus formed semiconductor thin film and heating it.

When the component (D) of the third silane composition or the fourth silane composition is a boron compound, the formed semiconductor thin film becomes a p type semiconductor thin film and when the component (D) is at least one compound selected from the group consisting of an arsenic compound, phosphorus compound and antimony compound, it becomes an n type semiconductor thin film.

A p type or n type semiconductor thin film may also be obtained by forming the coating film of the first silane composition or the second silane composition which comprises the components (A), (B) and (C) but no component (D) and the coating film of the composition which comprises the components (A), (B), (C) and (D) on the substrate and treating them with heat and/or light.

A coating film containing the component (D) can be formed on the semiconductor thin film by applying the third silane composition or the fourth silane composition which comprises the component (D) and optionally a solvent or a composition which comprises the components (D) and (B) and optionally a solvent to the semiconductor thin film and removing the solvent. The solvent used at this point may be identical to the solvent for the compositions used in the present invention. The content of the component (D) in the above composition is preferably 1 to 100 wt %.

The heat treating conditions are the same as those of heating described above for forming a semiconductor thin film.

When the thus obtained semiconductor thin film is amorphous, it may be treated with high energy light from an excimer laser to convert it into a polycrystalline semiconductor thin film. The atmosphere for carrying out this exposure is desirably the same as the non-oxidizing atmosphere for the above coating film forming step.

The solar cell produced in the present invention has at least two semiconductor thin films which differ in the concentration and/or type of an impurity between a pair of electrodes and a pn, pin, ip or in semiconductor junction. The solar cell produced in the present invention may have Schottky type junction of semiconductor and metal. Examples of the metal include gold, silver, copper, aluminum and titanium. The semiconductor thin film may be any one selected from n type, i type or p type semiconductor thin film. The solar cell produced in the present invention is obtained by forming at least one of the laminated semiconductor thin films by the above method. All of the laminated semiconductor thin films may be formed by the above method.

The laminated semiconductor thin films may be all amorphous or polycrystalline, or mixed.

The solar cell produced by the first production method of the present invention has electrodes, a conductive film for wiring and optionally an insulating film in addition to the above semiconductor thin film. All of them are not particularly limited but a metal film generally used in solar cells, transparent conductive film such as ITO and insulating film such as $SiO_2$ may be used. To form these, commonly used deposition, sputtering and CVD may be used and a liquid material which does not require a vacuum process may also be used.

Methods of forming a conductive film from a liquid material include one in which a suspension containing metal particles dispersed in an organic solvent is used, one making use of plating, and one in which an ITO thin film is formed by applying an organic compound containing indium and tin and heating the coating film.

Methods of forming an insulating film from a liquid material include one in which the coating film of the above semiconductor thin film forming composition is treated with heat and/or light in the presence of oxygen and/or ozone, for example, air, and one in which polysilazane is applied to a substrate and heated to convert it into $SiO_2$.

In the solar cell production method of the present invention, the above silicon film, conductive film and insulating film may be formed and patterned before use. In this case, they may be patterned by a general method such as masking or lithography, or the application of the liquid material and patterning may be carried out at the same time by an ink jet method.

A description is subsequently given of a second method of producing a solar cell.

In the second production method, the third silane composition or fourth silane composition of the present invention is used.

The second method of producing a solar cell is characterized in that in order to produce a solar cell having a structure that at least two semiconductor thin films which differ in the concentration and/or type of an impurity are laminated between a pair of electrodes, at least one of the semiconductor thin films is formed from the third silane composition or the fourth silane composition.

The semiconductor thin film formed by the second production method becomes a p type semiconductor thin film when the component (D) is a boron compound and an n type semiconductor thin film when the component (D) is at least one compound selected from an arsenic compound, phosphorus compound and antimony compound.

A p type or n type semiconductor thin film can also be obtained by forming a coating film of a composition which comprises the components (A) and (B) but no component (D) and a coating film of a composition which comprises the components (A), (B) and (D) on a substrate and then treating them with heat and/or light.

The thus formed p type or n type semiconductor thin film may be further doped with a boron atom or at least one atom selected from arsenic, phosphorus and antimony to increase the concentration of an impurity in the semiconductor thin film.

As for what is not described of the second production method herein, it should be understood that the description of the first production method is applied directly or with modifications obvious to one of ordinary skill in the art.

EXAMPLES

The following examples are provided for the purpose of further illustrating the present invention but are in no way to be taken as limiting.

Synthesis Example 1

After the inside of a 3-liter four-necked flask equipped with a thermometer, cooling condenser, dropping funnel and stirrer was substituted by argon gas, 1 liter of dried tetrahydrofuran and 18.3 g of metal lithium were fed to the flask and bubbled with the argon gas 333 g of diphenyl dichlorosilane was added to this suspension by a dropping funnel under agitation at 0 EC, and then stirring was continued at room temperature for 12 hours after the end of addition until metal lithium disappeared completely. The reaction mixture was poured into 5 liters of iced water to precipitate a reaction product. This precipitate was separated by filtration, washed with water well and then with cyclohexane, and vacuum dried to obtain 140 g of a white solid 100 g of this white solid and 1,000 ml of dried cyclohexane were fed to a 2-liter flask, 4 g of aluminum chloride was added, and dried hydrogen chloride gas was bubbled at room temperature under agitation for 8 hours. Separately, 40 g of lithium aluminum hydride and 400 ml of diethyl ether were fed to a 3-liter flask, the above reaction mixture was added to the flask in an argon atmosphere under agitation at 0 EC, stirred at the same temperature for 1 hour and further stirred at room temperature for 12 hours. When vacuum distillation was carried out at 70 EC and 10 mmHg after a by-product was removed from the reaction mixture, 10 g of an achromatic liquid was obtained. It was found from its IR, $^1$H-NMR, $^{29}$Si-NMR and GC-MS spectra that this liquid was cyclopentasilane.

Synthesis Example 2

When 10 g of cyclpentasilane obtained in Synthesis Example 1 was added to a 100 ml flask in an argon atmosphere and exposed to light from a 500 W high-pressure mercury lamp for 30 minutes under agitation, a white solid was obtained. The obtained white solid was insoluble in toluene and cyclohexane. When 100 g of cyclopentasilane obtained in Synthesis Example 1 was added to this white solid, an achromatic and transparent solution was obtained.

Synthesis Example 3

After the inside of a 1-liter four-necked flask equipped with a thermometer, condenser, dropping funnel and stirrer was substituted by argon gas, 500 ml of dried tetrahydrofuran and 9 g of metal lithium were fed to the flask and bubbled with the argon gas. A mixture of 126 g of diphenyl dichlorosilane and 25 of boron tribromide was added to this suspension by a dropping funnel under agitation at room temperature. After a reaction was continued until metal lithium disappeared completely, the reaction mixture was poured into iced water to precipitate a reaction product. This precipitate was separated by filtration, washed with water well and dried to obtain 90 g of a silicon compound having a phenyl group and boron 90 g of this compound was dissolved in 500 ml of toluene, 4 g of aluminum chloride was added to the solution, and dried hydrogen chloride gas was bubbled under cooling with ice and agitation for 8 hours. Separately, 12 g of lithium aluminum hydride and 250 ml of diethyl ether were fed to a 2-liter flask, the above reaction mixture was added to the flask in an argon atmosphere under agitation at 0 EC, stirred at the same temperature for 1 our and further stirred at room temperature for 12 hours. After an aluminum compound was removed, the residue was concentrated and purified to obtain 10 g of a modified silane compound containing boron of interest. This was found to be $Si_5H_{11}B$ by elemental analysis.

Synthesis Example 4

A modified silane compound containing phosphorus was obtained in the same manner as in Synthesis Example 3 except that 27 g of phosphorus tribromide was used in place of 25 g of boron tribromide. The compound was found to be $Si_5H_{11}P$ by elemental analysis.

Example 1

Figure 1:
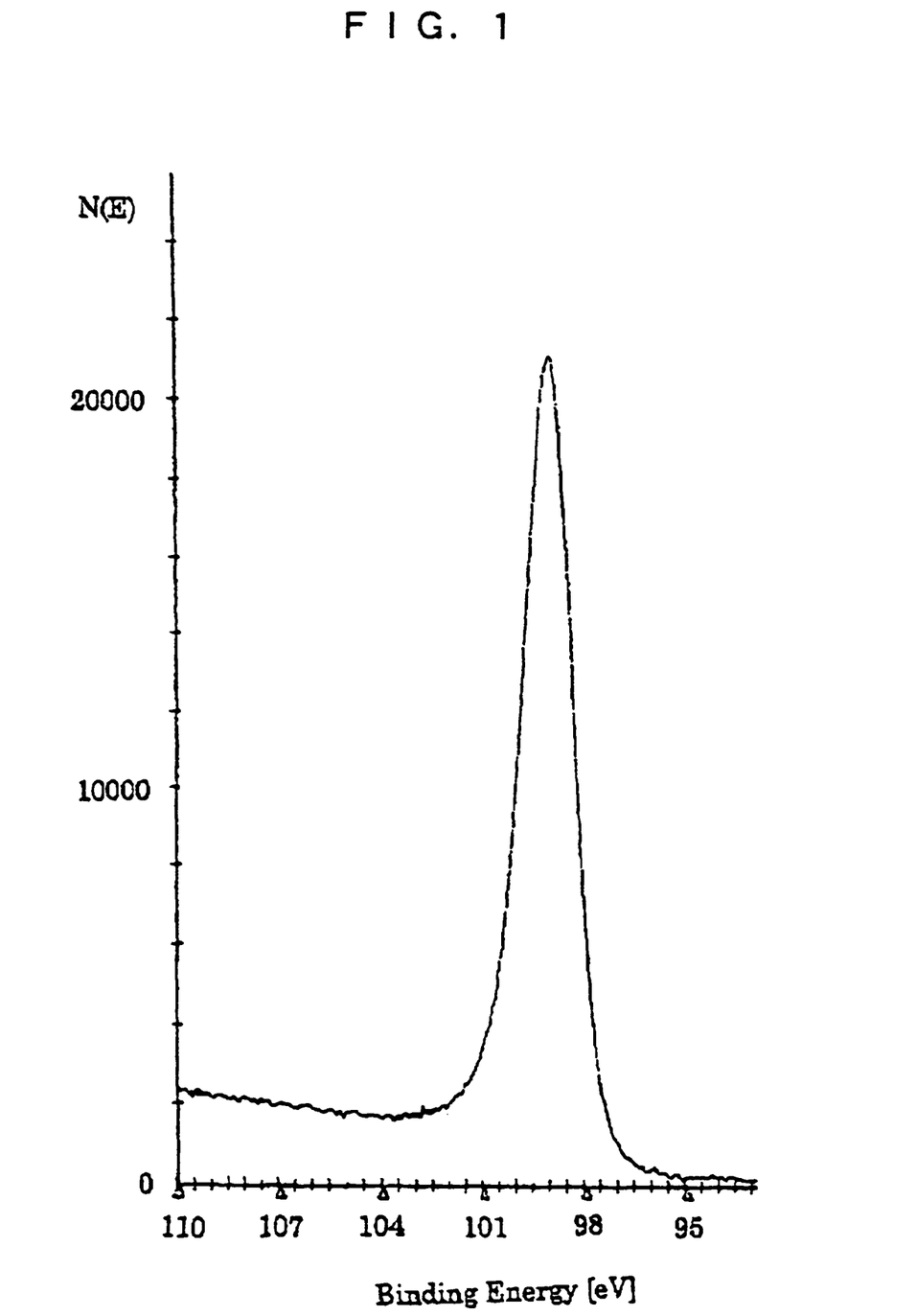
FIG. 1 is an ESCA spectral diagram of a silicon film obtained in Example 1.

A glass substrate was spin coated with the achromatic and transparent solution obtained in Synthesis Example 2 in a nitrogen gas atmosphere at a revolution of 2,000 rpm and set on a hot plate in a nitrogen gas atmosphere to be heated at 200 EC for 10 minutes and further at 500 EC for 15 minutes. The obtained coating film had a metallic gloss. When the ESCA spectrum of this thin film having a metallic gloss was measured, only a peak derived from Si was observed at 99 eV and other elements derived from a solvent such as carbon atoms were not detected at all. This ESCA spectrum is shown in FIG. 1.

This silicon film had a thickness of 80 nm. When XRD of this Si film was measured, a crystal peak was not observed, which proved that this film was an amorphous silicon film.

Example 2

Figure 2:
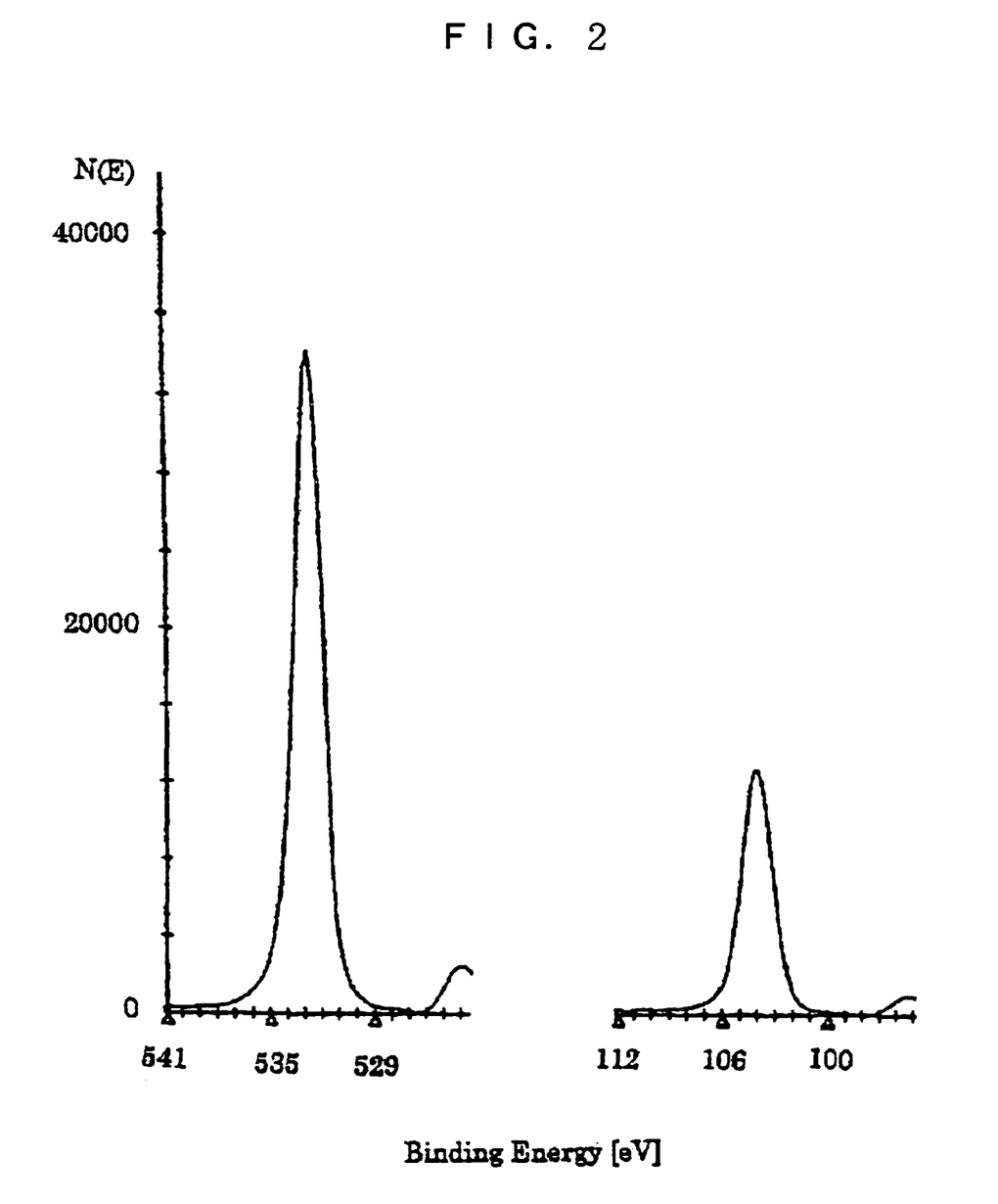
FIG. 2 is an ESCA spectral diagram of a silicon oxide film obtained in Example 2.

A film was formed in the same manner as in Example 1 except that the heat treatment was carried out at 500 EC in the air. The obtained coating film was transparent and had no metallic gloss. When the ESCA spectrum of this film was measured, only silicon and oxygen atoms were detected, which proved that this film was a silicon oxide film. Since the energy of the 2p orbit of this silicon was 104 eV, the film was found to be a $SiO_2$ film. This ESCA spectrum is shown in FIG. 2.

Comparative Example 1

When toluene was used in place of cyclopentasilane in Example 1, the white solid did not dissolve at all and therefore a polysilane film could not be formed.

Example 3

Figure 3:
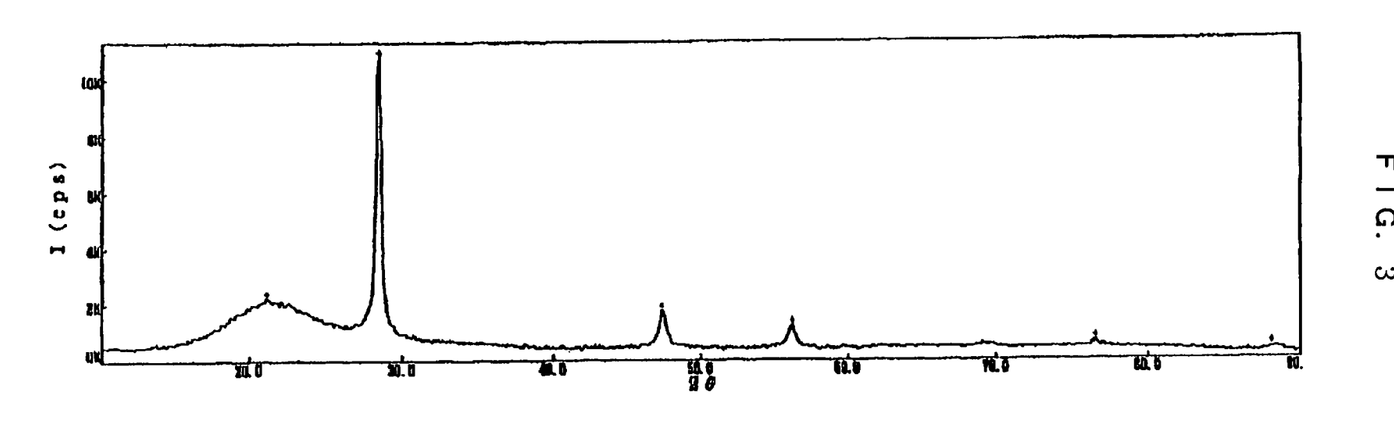
FIG. 3 is an X-ray diffraction diagram of a polycrystal silicon film obtained in Example 3.

10 g of silicon particles having a particle diameter of 0.2 to 1 :m obtained by classifying silicon powders (purity of 99.9995%) manufactured by Aldrich Co., Ltd. and 40 g of the solution prepared in Synthesis Example 2 were mixed together in a nitrogen atmosphere and uniformly dispersed in each other by a homogenizer. A glass substrate was spin coated with the thus prepared silane composition in a nitrogen atmosphere at 1,000 rpm, prebaked at 200 EC for 2 minutes and baked at 400 EC for 10 minutes. Thereafter, it was further baked at 500 EC for 30 minutes. As a result, a polysilicon film was formed on the glass substrate to a thickness of 2 :m. The X-ray diffraction diagram of this film is shown in FIG. 3.

Example 4

Figure 4:
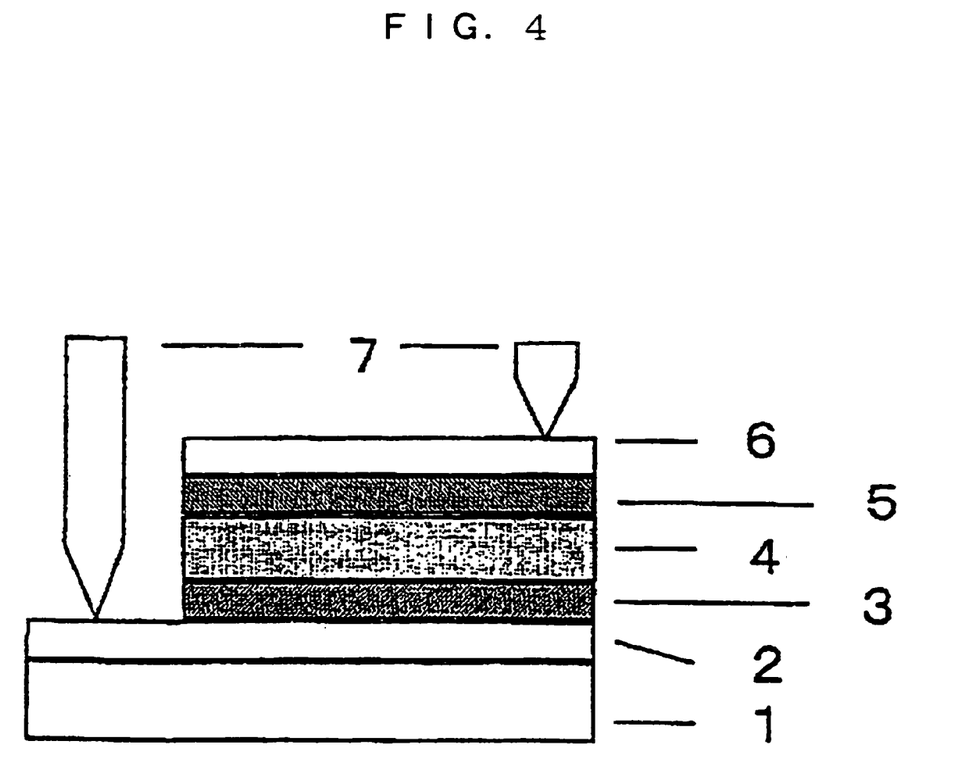
FIG. 4 is a diagram showing the structure of a solar cell.

A solar cell having a structure typically shown in FIG. 4 was produced on a quartz substrate having an ITO transparent conductive film formed thereon by the following method.

To form a p type silicon film 3 on the ITO film 2 of a substrate 1, 0.2 g of $Si_5H_{11}B$ obtained in Synthesis Example 3 and 10 g of the silane composition obtained in Example 3 were mixed together to prepare a silane composition. A polysilicon film having a thickness of 0.4 :m was formed from this composition in an argon atmosphere in the same manner as in Example 3.

To form an i type silicon film 4, the composition obtained in Example 3 was applied to the substrate having the above silicon film 3 formed thereon by spin coating in an argon atmosphere at 1,000 rpm and baked in the same manner as in Example 3 to form an i type polysilicon film having a thickness of 2 :m.

In order to further form an n type silicon film 5, 0.2 g of $Si_5H_{11}P$ obtained in Synthesis Example 4 and 10 g of the solution prepared in Example 3 were mixed together to prepare a coating solution. This solution was applied to the substrate having the above silicon film laminated thereon by spin coating in an argon atmosphere at 2,000 rpm and baked in the same manner as in Example 3 to form an n type polysilicon film having a thickness of 0.4 :m.

An aluminum film 6 was deposited to a thickness of 0.5 :m on part of the thus formed laminate film having a pin junction structure using a mask, and portions devoid of the aluminum film were etched until the underlying ITO film was exposed so as to produce a solar cell having a structure shown in FIG. 4. The conversion efficiency obtained by measuring the optically electromotive force of this solar cell was 14.0%. Reference numeral 7 in FIG. 4 denotes a probe electrode.

Example 5

A solar cell having a structure typically shown in FIG. 4 was produced on a quartz substrate having an ITO transparent conductive film formed thereon by the following method.

1 g of $Si_5H_{11}B$ obtained in Synthesis Example 3 and 50 g of the solution prepared in Synthesis Example 2 were mixed together to prepare a coating solution to form a p type silicon film on the ITO film. The above substrate was spin coated with this solution in an argon atmosphere, dried at 150 EC for 10 minutes and thermally decomposed at 450 EC in argon atmosphere for 30 minutes to form a 200 nm-thick amorphous silicon film.

Thereafter, in order to form an i type silicon film, the solution of Synthesis Example 2 was applied to the substrate having the above silicon film formed thereon by spin coating in an argon atmosphere, dried at 150 EC for 10 minutes, and thermally decomposed at 450 EC in argon atmosphere for 30 minutes to form an i type amorphous silicon film having a thickness of 1,000 nm.

To further form an n type silicon film, 1 g of $Si_5H_{11}P$ obtained in Synthesis Example 4 and 50 g of the solution prepared in Synthesis Example 2 were mixed together to prepare a coating solution. This solution was applied to the substrate having the above silicon film laminated thereon by spin coating in an argon atmosphere, dried at 150 EC for 10 minutes and thermally decomposed at 450 EC in an argon atmosphere for 30 minutes to form an n type amorphous silicon film having a thickness of 200 nm.

An aluminum film was deposited to a thickness of 0.5 :m on part of the thus formed laminate film having a pin junction structure using a mask, and portions devoid of the aluminum film were etched until the underlying ITO film was exposed to produce a solar cell having a structure shown in FIG. 4. The conversion efficiency obtained by measuring the optically electromotive force of this solar cell was 6.0%.

Example 6

The procedure of Example 5 was repeated to produce a solar cell having a structure shown in FIG. 4 and comprising three polysilicon thin films having thicknesses of 600 nm, 3,000 nm and 600 nm except that the application of a silane composition and a thermal decomposition step were each repeated three times in the step of forming p, i and n type amorphous silicon films in Example 3 and that the formed amorphous silicon films were exposed to laser beams from an excimer laser having an energy density of 320 mJ/cm$^2$ and a wavelength of 308 nm for 10 minutes to convert them into polysilicon films. The conversion efficiency obtained by measuring the optically electromotive force of this solar cell was 12.0%.

What is claimed is:

1. A method of forming a silicon film on a substrate, comprising forming a coating film of a silane composition on the substrate and treating it with heat and/or light in a non-oxidizing atmosphere, wherein the silane composition comprises:
   (A) a polysilane compound represented by the formula $Si_nR_m$, wherein n is an integer of 3 or more, m is an integer of n to (2n+2) and an m number of R's are each independently a hydrogen atom, alkyl group, phenyl group or halogen atom, with the proviso that when all the m number of R's are hydrogen atoms and m=2n, n is an integer of 7 or more; and
   (B) at least one silane compound selected from the group consisting of cyclopentasilane, cyclohexasilane and silylcyclopentasilane; and (C) silicon particles.

2. The method according to claim 1, wherein R is an alkyl group having 1 to 10 carbon atoms.

3. The method according to claim 1, wherein the halogen atom is selected from the group consisting of fluorine, chlorine and bromine.

4. The method according to claim 1, wherein n is an integer of 7 to 100,000.

5. The method according to claim 1, wherein the (B) component comprises cyclopentasilane.

6. The method according to claim 1, wherein the (B) component comprises cyclohexasilane.

7. The method according to claim 1, wherein the (B) component comprises silylcyclopentasilane.

8. The method according to claim 1, wherein a proportion of the polysilane compound to the silane compound is 0.01 to 1,000 wt %.

9. The method according to claim 1, wherein a particle diameter of the silicon particles is 0.005 to 1,000 μm.

10. The method according to claim 1, wherein the silicon particles are 0.01 to 200 wt % based on the total weight of the (A) and (B) components.

11. The method according to claim 1, wherein the silicon particles are amorphous or crystalline.

12. A method of forming a silicon oxide film on a substrate, comprising forming a coating film of a silane composition on the substrate and treating it with heat and/or light in an atmosphere containing oxygen and/or ozone, wherein the silane composition comprises:
   (A) a polysilane compound represented by the formula $Si_nR_m$, wherein n is an integer of 3 or more, m is an integer of n to (2n+2) and an m number of R's are each independently a hydrogen atom, alkyl group, phenyl group or halogen atom, with the proviso that when all the m number of R's are hydrogen atoms and m=2n, n is an integer of 7 or more; and
   (B) at least one silane compound selected from the group consisting of cyclopentasilane, cyclohexasilane and silylcyclopentasilane.

13. The method according to claim 12, which further comprises (C) silicon particles.

14. A method of producing a solar cell having a structure that at least two semiconductor thin films which differ in the concentration and/or type of an impurity are laminated between a pair of electrodes, wherein at least one of the semiconductor thin films is formed by a method comprising the step of applying a silane composition to the substrate to form a coating film and the step of treating the coating film with heat and/or light, wherein the silane composition comprises:
   (A) a polysilane compound represented by the formula $Si_nR_m$, wherein n is an integer of 3 or more, m is an integer of n to (2n+2) and an m number of R's are each independently a hydrogen atom, alkyl group, phenyl group or halogen atom, with the proviso that when all the m number of R's are hydrogen atoms and m=2n, n is an integer of 7 or more; and
   (B) at least one silane compound selected from the group consisting of cyclopentasilane, cyclohexasilane and silylcyclopentasilane; and (C) silicone particles.

15. The method according to claim 14, wherein the semiconductor thin film to be formed is an i type silicon thin film.

16. The method according to claim 14, wherein at least one of the semiconductor thin films is a p type or n type silicon thin film formed by a method further comprising the step of doping at least one atom selected from boron, arsenic, phosphorus and antimony.

17. A method of producing a solar cell having a structure that at least two semiconductor thin films which differ in the concentration and/or type of an impurity are laminated between a pair of electrodes, wherein at least one of the semiconductor thin films is a p type or n type silicon thin film formed by a method comprising the step of applying a silane composition to the substrate to form a coating film and the step of treating the coating film with heat and/or light, where the silane composition comprises:
- (A) a polysilane compound represented by the formula $Si_nR_m$, wherein n is an integer of 3 or more, m is an integer of n to (2n+2), and an m number of R's are each independently a hydrogen atom, alkyl group, phenyl group or halogen atom, with the proviso that when all the m number of R's are hydrogen atoms and m=2n, n is an integer of 7 or more;
- (B) at least one silane compound selected from the group consisting of cyclopentasilane, cyclohexasilane and silylcyclopentasilane; (C) silicone particles; and
- (D) at least one compound selected from the group consisting of a boron compound, arsenic compound, phosphorus compound, antimony compound and modified silane compound represented by the formula $Si_aX_bY_c$; wherein X is a hydrogen atom and/or halogen atom, Y is a boron atom or phosphorus atom, a is an integer of 3 or more, b is an integer from 1 to a, and c is an integer from a to (2a+b+2).

18. The method according to claim 17, wherein the semiconductor thin film to be formed is an amorphous silicon thin film.

19. The method according to claim 17, wherein the semiconductor thin film to be formed is a polysilicon thin film.

20. The method according to claim 17, wherein the boron compound is selected from the group consisting of a boron hydride, alkylboron, arylboron, and a boron compound having a trimethylsilyl group.

21. The method according to claim 17, wherein the arsenic compound is selected from the group consisting of an alkylarsenic, arylarsenic, and an arsenic compound having a trimethylsilyl group.

22. The method according to claim 17, wherein the phosphorus compound is selected from the group consisting of an alkylphosphorus, arylphosphorus, and a phosphorus compound having a trimethylsilyl group.

23. The method according to claim 17, wherein the antimony compound is selected from the group consisting of an alkylantimony and an arylantimony.

24. The method according to claim 17, wherein the modified silane compound is selected from the group consisting of:

SiH3(SiH2)eBH2, and SiCl3(SiCl2)eBCl2, wherein u is an interger of 0 to 10 and e is an integer of 2 or more.

* * * * *